United States Patent [19]

Maracas et al.

[11] Patent Number: 5,073,230
[45] Date of Patent: Dec. 17, 1991

[54] MEANS AND METHODS OF LIFTING AND RELOCATING AN EPITAXIAL DEVICE LAYER

[75] Inventors: George N. Maracas, Tempe; Ronald A. Ruechner, Mesa; Donald S. Gerber, Scottsdale, all of Ariz.

[73] Assignee: Arizona Board of Regents acting on behalf of Arizona State University, Tempe, Ariz.

[21] Appl. No.: 510,276

[22] Filed: Apr. 17, 1990

[51] Int. Cl.⁵ ............................................. H01L 21/00
[52] U.S. Cl. ................................... 156/631; 156/633; 156/655; 156/659.1; 156/660; 156/662
[58] Field of Search ...................... 156/659.1, 660, 662, 156/655, 631, 629, 633

[56] References Cited

U.S. PATENT DOCUMENTS

| | | | |
|---|---|---|---|
| 4,738,746 | 4/1988 | Clarion | 156/656 X |
| 4,883,561 | 11/1989 | Gmitter et al. | 156/662 X |

*Primary Examiner*—David A. Simmons
*Assistant Examiner*—Thi Dang
*Attorney, Agent, or Firm*—Richard R. Mybeck

[57] ABSTRACT

Means and methods for obtaining the separation of large area semiconductor epitaxial device layers from the substrates on which they are grown, the transfer of the grown epi layers to a new host substrate for mounted alignment with features of the new host, and reuse of the original substrate.

27 Claims, 1 Drawing Sheet

MEANS AND METHODS OF LIFTING AND RELOCATING AN EPITAXIAL DEVICE LAYER

INTRODUCTION

The present invention relates to epitaxially grown films and devices and more particularly to a method of releasing such films and/or devices from the single crystal substrate upon which it is formed to enable its transfer to other substrates and reuse the original substrate.

BACKGROUND OF THE INVENTION

In thin film technology there has always been a tradeoff between the material quality of the film and the ease of depositing that thin film. Epitaxial films represent the highest level of quality, but they must be grown on and are accompanied by cumbersome, expensive, bulk single crystal wafer substrates. For some time, research has focused on the possibility of creating epitaxial quality thin films on arbitrary substrates while maintaining the ultimate in crystalline perfection.

The main approach has been to attempt to reuse the substrate wafer by separating it from the epitaxially grown film. However, to undercut a very thin film over its entire area without adversely affecting the film or the underlying substrate, the selectivity must be extremely high. This is very difficult to achieve. For example, J. C. Fan [see J. C. Fan, J. Phys. (parts) 43. 1–327 (1982)] has described a process in which an epitaxial film is cleaved away from the substrate on which it is grown. Such cleavage, at best, is difficult to achieve without damage to the film and/or substrate, or without removal of part of the substrate. Also, in some instances, the cleavage plane ($<110>$) and the growth plane ($<100>$) of the film may be mutually exclusive.

In a paper by Konagai et.al. [see: J. of Crystal Growth 45, 277–280 (1978)], it was shown that a Zn doped p-$Ga_{1-x}Al_xAx$ layer can be selectively etched from GaAs with Hydrofluoric acid (HF). This observation was employed in the production of thin film solar cells by a number of techniques. In one technique, zinc doped p-$Ga_{1-x}Al_xAs$ was grown by liquid phase epitaxy (LPE) on a n-GaAs grown layer on a GaAs single crystal substrate. During this LPE growth of the Zn $Ga_{1-x}Al_xAs_x$, Zn diffuses into the surface of the underlying GaAs to form a p-type GaAs layer and hence p-n GaAs junction. The surface p-$Ga_{1-x}Al_xAs$ is then selectively etched away leaving the p-n junction GaAs layers on the GaAs substrate.

In another process for fabricating solar cells, Konagai et.al. (op.cit.) describe a "peeled film technology". Here, a 5 micron thick $Ga_{0.3}Al_{0.7}As$ film is epitaxially grown on a GaAs $<111>$ substrate by LPE. A 30 micron thick Sn doped n-GaAs layer is then grown over the $Ga_{0.3}Al_{0.7}As$ layer and a p-n junction is formed by diffusing Zn into the specimen utilizing $ZnAs_2$ as the source of Zn. Appropriate electrical contacts are then formed on the films using known photoresist, etch and plating techniques The surface layer is then covered with a black wax film support layer and the wafer is soaked in an aqueous HF etchant solution. The etchants selectively dissolves the $Ga_{0.3}Al_{0.7}As$ layer which lies between the thin solar cell p-n junction device layers and underlying substrate, allowing the solar cell attached to the wax to be peeled off the GaAs substrate for placement on an aluminum substrate. The wax provides support for the peeled film prior to attachment to the new substrate.

While the technique described above has been described in the literature for about twelve years, it was not adopted by the industry. One reason for shunning the technique was the difficulty encountered in completely undercutting the $Ga_{0.3}Al_{0.7}As$ 'release' layer in a reasonable time, especially when the area of the film to be peeled was large. This difficulty was thought to be due to the formation and entrapment of gas, formed as a reaction product of the etching process within the etched channel. The gas could create a bubble in the channel, for example, thereby preventing or diminishing further etching and causing cracking in the epitaxial film. The problem could only be partially obviated by using very slow reaction rates (very dilute HF solutions). Since the time required for peel-off, and the need to ensure that no change, or at least minimal change, to the overlying film is important, the process was virtually abandoned.

A means for providing for the needed circulation of etchant and reaction products and the release of any gaseous reaction products of the etching process while maintaining high selectivity is therefore desired.

One such attempt to resolve the prior art problems is described by T. J. Gmitter et.al. in U.S. Pat. No. 4,846,931 who developed a process which employs a single crystal semiconductor substrate upon which has been grown, by some standard process such as MBE, MOCVD, VPE, and the like, an epitaxial ("epi") layer in which electronic, optical or other devices have been or will be made. A key part of the epi layer, however, is that at the bottom of the epi layer which is to be removed from the substrate, a "release layer" of semiconductor is grown or otherwise introduced. This release layer is thin (on the order of tens or hundreds of angstroms) and will later be etched away in an acid or other solution, thus undercutting the overlaid epi to ultimately separate it from the substrate upon which it was grown. Next, Gmitter et.al. apply a polymeric tension/support layer comprising a black wax/solvent mixture. Two primary functions are attributed by Gmitter et.al. to this layer. The first is that it is necessary for the polymeric layer to be in tension on the epi layer (so that the epi layer is in compression) whereupon the polymer/epi combination will curl up at its edges while the release layer is dissolved by the etch solution. It is asserted that this curling is essential in order for the reaction products of the etching, that is, the evolved gas, to be removed from the etched area through the thin channel opening of the release layer without blocking the progress of the etch. The second function claimed for the polymeric layer is that it provides mechanical support for the very thin and fragile epi layer once it is removed from the underlying substrate on which it was grown. After applying the polymeric tension/support layer Gmitter et.al. immerse the polymer/epi/substrate combination into an appropriate etch solution which dissolves the release layer and allows the epi/polymer combination to float free of the substrate. The freed epi layer is then adhered to a new substrate by using van der Waal's forces or an appropriate glue. Gmitter et.al. complete the process by removing the polymeric tension/support layer whereupon the epi layer is left attached to the new substrate.

Significance of the teaching of Gmitter et.al. lies in their demonstration that different semiconductor technologies can be combined on a common substrate; that semiconductor devices can be stacked in three dimensions to produce higher levels of integration; and that semiconductor devices can be freed from the substrate upon which they were grown (which substrate can posses undesirable properties) and placed on new substrates upon which they could not originally have been grown but which have more desirable properties. In addition, the substrates upon which the epi layers were originally grown can be reused to grow new epi layers, saving the expense of acquiring new substrates for future growths.

Notwithstanding the significant advances brought to semiconductor processing and device technology by Gmitter et.al., two very important problems were left unresolved namely, the procedure (a) does not lend itself well to the mass transfer of lifted-off epi layers to a new substrate; and (b) does not permit the lifted-off layers to be readily aligned with other devices or features on the new substrate. These two problems are critical because they limit the practicality of Gmitter et.al. lift-off on the large scale necessary for industrial implementation.

There are other less important, albeit significant, problems with the Gmitter et.al. procedure such as: the polymeric layer is somewhat fragile and per se flexible which creates difficulties in handling epi layers attached to it and in getting those epi layers to lie flat on the new substrate after transfer; very small pieces of epi are difficult to handle and transfer; very large epi layers, that is, those approaching the size of an entire 2" or 3" wafer become impractical to lift-off because the long etch time, (i.e., days), required to undercut the epi completely from the edge and the difficulty in handling the resulting large and fairly delicate polymer/epi combination after lift-off. These problems have further prevented Gmitter et.al. from being accepted for use in a production environment and accentuate the need toward which the present invention is directed.

BRIEF SUMMARY OF THE PRESENT INVENTION

The present invention relates to epitaxially grown films and more particularly involves the removal of an epitaxial device layer from the substrate on which it was grown by etching a release layer of semiconductor disposed between the epi layer and substrate. When the release layer is completely etched away, the epi layer becomes free of the original substrate and can be transferred using the novel means hereinafter disclosed, to a new substrate to which it is permanently attached by van der Waal's bonding or by a permanent adhesive layer.

The present invention recognizes that the epi layer by itself is very fragile and permits an entire wafer of epi layer produced hereby to be removed intact, readily aligned with features on a new host substrate, and secured thereto with dimensional integrity. The present invention thus allows batch processing of integrated circuits and devices to be achieved in a manner which is economically feasible for mass manufacture.

As will hereinafer appear, the present invention is especially significant in that it allows different technologies to be combined on a common substrate (for example, GaAs devices on a silicon IC) without having to grow both semiconductors on the same substrate which when desired, can be poly- or noncrystalline substrates such as glasses or polymers; devices to be stacked in three dimensions thereby permitting the formation of higher levels of integration and unique structures; devices to be transferred to substrates having more desirable properties than those of the substrate on which they were originally grown; and reuse of the original substrates from which the epi layers are removed thereby saving the expense of obtaining new substrates each time a new growth is desired.

Accordingly, a principle object of the present invention is to provide novel means and methods for lifting and relocating an epitaxial device layer which permits batch processing of integrated circuits in an economically viable fashion.

Another object of the present invention is to provide novel means and methods which permits an entire wafer of epi layers to be readily removed from a first substrate and precisely relocated upon a second substrate, either alone or in combination with different technologies.

A further object of the present invention is to provide novel means and methods which permits a plurality of different technologies and/or devices to be transferred to a different preselected substrate including even poly- or noncrystalline substrate, and to be stacked thereupon in three dimensions.

These and still further objects as shall hereinafter appear are fulfilled by the present invention in a remarkably unexpected fashion as can be readily discerned from a careful consideration of the following description of exemplary embodiments thereof, especially when read in conjunction with the accompanying drawings in which like parts bear like numbers throughout the several views.

DESCRIPTION OF THE PREFERRED EMBODIMENTS

The present invention is predicated upon the discovery of unique means and methods of lifting off an epitaxial film from the substrate upon which it is grown so as to substantially eliminate the problems encountered in the prior art in transferring epi layers from a first layer to lay flat once a transplant is successfully executed.

Figure 1:
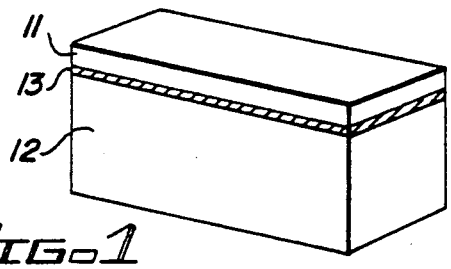
FIG. 1 is an isometric representation of a device comprising an epitaxial layer, a release layer, and a substrate as grown and prior to lift-off pursuant to the present invention.

As shown in FIG. 1, an epitaxial layer 11 is mounted on a original substrate 12, and a suitable release layer 13 is operatively interposed therebetween.

The epitaxial layer 11 is then attached to a rigid flat support member or mask 14, which may be a silicon wafer or a wafer of similar material by a temporary adhesive layer 15 characterized by its ability to withstand attack by the lift-off etch solution as hereinafter described. Photoresist has been found to provide quite satisfactory results when employed as layer 15 although other polymeric and nonpolymeric materials having the specified properties can also be used. By "specified properties" is meant that (1) it can be patterned by, for example, exposure and develop or by etching, (2) it bonds the rigid support mask securely to the underlying epi layer/wafer combination, (3) it withstands the lift-off etch solution (4) it can be etched away or dissolved after transfer of the epi layer to the new substrate so as to detach the rigid support layer.

Figure 2:
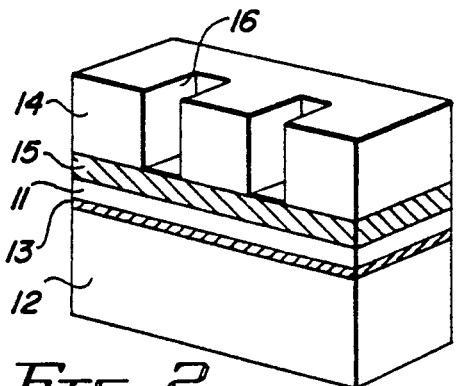
FIG. 2 is an isometric representation of the device of FIG. 1 having a temporary adhesive and a rigid support mask disposed thereupon in accordance with the present invention.
Figure 3:
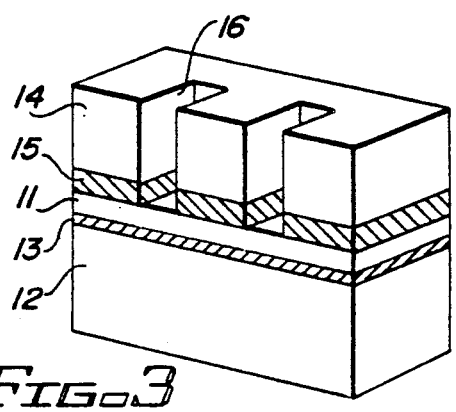
FIG. 3 is an isometric representation of the device of FIG. 2 after the holes in the rigid support mask have been extended through the temporary adhesive layer in accordance with the present invention.
Figure 4:
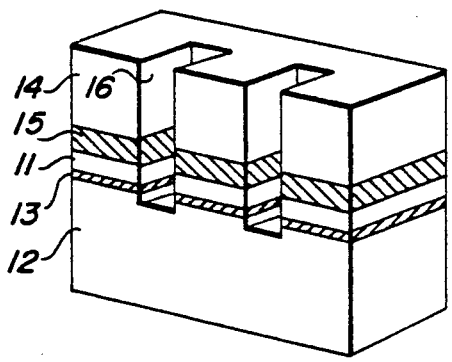
FIG. 4 is an representation of the device of FIG. 3 after the holes in the support mask have been further extended through the epitaxial layer, the release layer and into the original substrate in accordance with the present invention.

As shown in FIG. 2, rigid support layer 14 has a pattern of holes 16 defined therein which is then transferred first to the underlying adhesive layer 15, as shown in FIG. 3, and then to the epi layer 11 and substrate 12 through release layer 13 as shown in FIG. 4. The transfer of the pattern of holes 16 is obtained using standard semiconductor lithographic processes.

Figure 5:
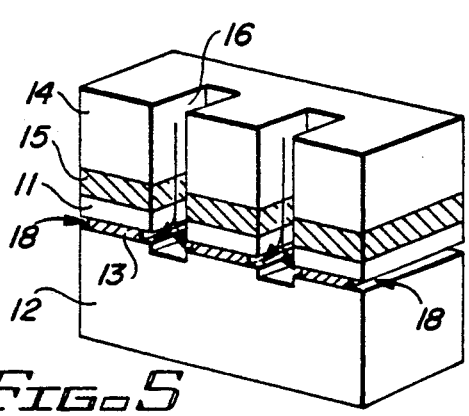
FIG. 5 is a representation of the device of FIG. 4 upon initiation of the lift-off of the release layer in accordance with the present invention.
Figure 7:
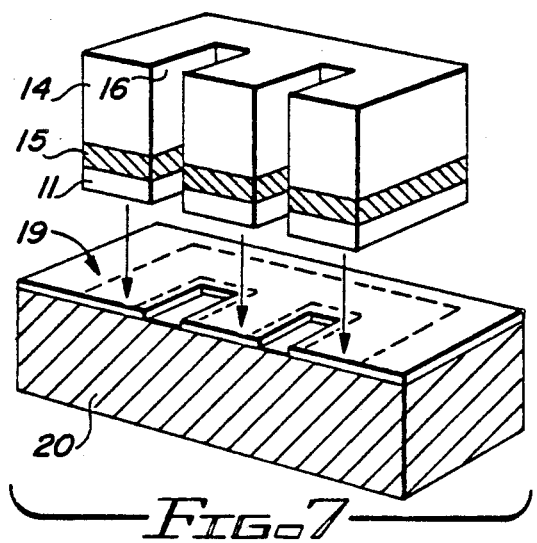
FIG. 7 is a representation of the separated epitaxial layer of FIG. 6 in juxtaposition with a new substrate in accordance with the present invention.
Figure 8:
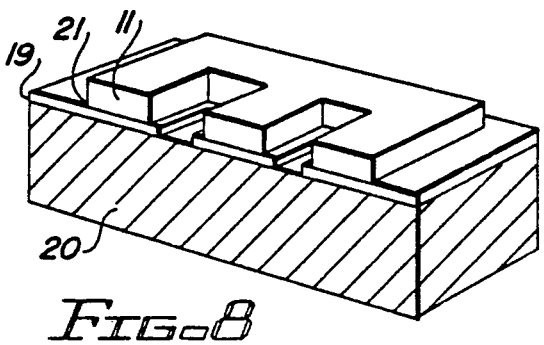
FIG. 8 is a representation of a new epitaxial device prepared in accordance with the present invention.

As shown in FIG. 5, the extension of holes 16 down into substrate 12 enables the lift-off etch solution to undercut the epi layer 11 from the interior of the substrate 12 as well as from the edge 18 thereof, thereby substantially shortening the etch time. Simultaneously, the holes 16 in the rigid support 14 allow for alignment of an array of lifted-off epi pieces to features (circuits, devices, chips, marks, and the like 19) on the new substrate 20 in mass as shown in FIG. 7 and 8.

The epi layer 11, when attached as described to the rigid support/mask 14 (a silicon wafer, for example), is not allowed to curl up at the edges as the lift-off etch proceeds. Even using the conventional type of release layer (AlAs) and etch solution (10:1 water:hydrofluoric acid) the present invention enables the lift-off of sizable epi layer pieces. Following the present invention, the polymeric tension/support layer heretofore required for the success of the lift-off etch, is no longer essential.

In one practice of the present invention, as shown in the drawing, the process begins with a conventional type of epitaxial layer 11/ release layer 13/ substrate 12 combination (see: FIG. 1) to which a temporary adhesive layer 13 is applied and the rigid support/mask 14 is attached as shown in FIG. 2. A portion of adhesive layer 13 corresponding to the holes 16 of the rigid support/mask 14 is then removed as shown in FIG. 3 by etching or by exposure to light and development if the adhesive is a photosensitive material.

Figure 6:
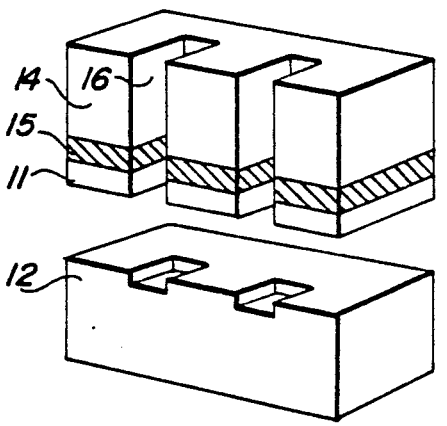
FIG. 6 is a representation of the device of FIG. 5 upon completion of the etch and after complete separation of the epitaxial layer from its original substrate.

The epi layer 11 is then etched down to or through the release layer as shown is FIG. 4. The resulting combination is then placed in the lift-off etch solution and the release layer etched away as shown in FIG. 5, leaving the epitaxial layer 11 still attached to the rigid support/mask 14 by the temporary adhesive layer 15, but free of substrate 12 as shown in FIG. 6.

Next, the epi layer is transferred to the new substrate 20 and aligned to the features 19 on it, if necessary, by viewing through the holes 16 in the rigid support/mask 14 as shown in FIG. 7. Adhesion of the epi layer 11 to the new substrate 20 is effected using conventional technology such as van der Waal's forces or by a layer 21 of an appropriate permanent adhesive, such as optical cement or the like. Once support mask 14 is free of epi layer 11, the temporary adhesive layer 13 is also removed from the rigid support/mask 14 enabling the mask 14 to be used in future lift-off process runs.

The rigid support/mask 14 is also reusable, unlike the polymeric support/tension layer of the prior art, for the simultaneous lift-off of a grid array, for example, of chips from one substrate and alignment to a similar array of chips on a new substrate. In this way, an entire wafer of epi layer can be lifted-off of one substrate and placed upon another wafer of patterned devices or circuits in one operation, thereby making the method hereof suitable for mass manufacture in a manner similar to the batch processing which makes integrated circuit production economically practical.

While it will be apparent to one skilled in the art that the means and methods herein described and illustrated can utilize a variety of materials, highly successful results are obtained with the present invention when mask 14 is formed of silicon wafers; the temporary adhesive layer 15 is formed of positive photoresist; the epitaxial layer 11 is GaAs, $Al_xGa_{1-x}As$, or AlAs: the release layer 13 is 10–1000A thick and formed of AlAs; the substrate is GaAs; and the etchant is $HF:H_2O$ (1:5 to 1:20).

It is of course understood that such other modifications, adaptations and alterations as will readily occur to the artisan when confronted with this disclosure are intended with the spirit of this invention which is limited solely by the scope of the claims appended hereto.

Accordingly, what is claimed is:

1. A process for selectively freeing without curling an epitaxial film from an original substrate upon which it was grown having a release layer operatively interposed therebetween, and transferring such film to a new substrate comprising the steps of: placing a layer of temporary adhesive over the epitaxial film; placing a planar rigid support mask having holes strategically defined therein upon said temporary adhesive layer; extending said holes in said support mask downwardly through said temporary adhesive layer, said epitaxial film, and said release layer; directing an etchant through said extended holes to engage and eliminate said release layer from between said epitaxial film and said substrate; raising said rigid support mask having said epitaxial film secured thereto by said temporary adhesive to separate said epitaxial film from said original substrate; positioning said rigid support mask in alignment over a new substrate; securing said epitaxial film to said substrate, and removing said support means and said temporary adhesive from said transplanted epitaxial film.

2. A process according to claim 1 in which said epitaxial film is selected from the group consisting of GaAs, $Al_xGa_{1-x}As$ and AlAs.

3. A process according to claim 1 in which said etchant comprises hydrofluoric acid and water in a ratio of from about 1:5 to about 1:20.

4. A process according to claim 2 in which said etchant comprises hydrofluoric acid and water in a ratio of from about 1:5 to about 1:20.

5. A process according to claim 1 in which said holes are extended down into said original substrate.

6. A process according to claim 2 in which said holes are extended down into said original substrate.

7. A process according to claim 3 in which said holes are extended down into said original substrate.

8. A process according to claim 1 in which said epitaxial film is secured to said new substrate by van der Waal's bonding.

9. A process according to claim 1 in which said epitaxial film is secured to said new substrate by permanent adhesive.

10. A process according to claim 1 in which said temporary adhesive layer is positive photoresist.

11. A process according to claim 2 in which said temporary adhesive layer is positive photoresist.

12. A process according to claim 3 in which said temporary adhesive layer is positive photoresist.

13. A process according to claim 5 in which said temporary adhesive layer is positive photoresist.

14. A process according to claim 1 in which said support mask is formed of silicon wafer.

15. A process according to claim 12 in which said support mask is formed of silicon wafer.

16. A process according to claim 10 in which said support mask is formed of silicon wafer.

17. A process according to claim 1 in which said release layer is AlAs.

18. A process according to claim 16 in which said release layer is AlAs.

19. A process according to claim 11 in which said release layer is AlAs.

20. A process according to claim 15 in which said release layer is AlAs.

21. A process according to claim 4 in which said holes are extended down into said original substrate.

22. A process according to claim 21 in which said temporary adhesive layer is positive photoresist.

23. A process according to claim 17 in which said temporary adhesive layer is positive photoresist.

24. A process according to claim 22 in which said support mask is formed of silicon wafer.

25. A process for selectively freeing without curling an epitaxial layer from an original substrate upon which it was grown having a release layer of AlAs operatively interposed therebetween, and transferring said epitaxial layer to a new substrate, said process comprising the steps of: placing a layer of positive photoresist as a temporary adhesive over the epitaxial layer selected from the group consisting of GaAs, $Al_xGa_{1-x}As$ and AlAs; placing upon said temporary adhesive layer a planar rigid silicon wafer support wafer support mask having holes strategically defined therein; extending said holes in said support mask downwardly through said temporary adhesive layer, said eiptaxial layer, and said release layer; directing an etchant comprising hydrofluoric acid and water in a ratio of from about 1:5 to about 1:20 into said original substrate through said extended holes to engage and eliminate said release layer from between said eiptaxial layer and said substrate; raising said rigid support mask having said epitaxial layer secured thereto by said temporary adhesive to separate said epitaxial layer secured thereto by said original substrate; positioning said rigid support mask n alignment over a new substrate; securing said epitaxial layer to said substrate, and removing said support means and said temporary adhesive from said transplanted eiptaxial layer.

26. A process according to claim 25 in which said epitaxial layer is secured to said new substrate by van der Waal's bonding.

27. A process according to claim 25 in which said epitaxial layer is secured to said new substrate by permanent adhesive.

* * * * *